US012675052B2

(12) United States Patent
Stratis et al.

(10) Patent No.: US 12,675,052 B2
(45) Date of Patent: Jul. 7, 2026

(54) SUBSTRATE WARPAGE DETERMINATION SYSTEM

(71) Applicant: ASML Netherlands B.V., Veldhoven (NL)

(72) Inventors: Efthymios Stratis, Eindhoven (NL); Oleksiy Sergiyovich Galaktionov, Geldrop (NL); Thomas Poiesz, Veldhoven (NL); Ilya Malakhovsky, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 100 days.

(21) Appl. No.: 18/851,601

(22) PCT Filed: Mar. 17, 2023

(86) PCT No.: PCT/EP2023/056847
§ 371 (c)(1),
(2) Date: Sep. 26, 2024

(87) PCT Pub. No.: WO2023/186569
PCT Pub. Date: Oct. 5, 2023

(65) Prior Publication Data
US 2025/0199421 A1 Jun. 19, 2025

(30) Foreign Application Priority Data
Mar. 31, 2022 (EP) ..................................... 22166063

(51) Int. Cl.
G03F 7/00 (2006.01)
(52) U.S. Cl.
CPC ...... G03F 7/70783 (2013.01); G03F 7/70725 (2013.01); G03F 7/7085 (2013.01)

(58) Field of Classification Search
CPC .. G03F 7/707; G03F 7/70725; G03F 7/70783; G03F 7/7085
See application file for complete search history.

(56) References Cited

U.S. PATENT DOCUMENTS 6,020,964 A 2/2000 Loopstra et al.
6,952,253 B2 10/2005 Lof et al.
(Continued)

FOREIGN PATENT DOCUMENTS

EP 3 764 165 A1 1/2021
EP 3 851 916 A1 7/2021
(Continued)

OTHER PUBLICATIONS

International Search Report and Written Opinion of the International Searching Authority directed to International Patent Application No. PCT/EP2023/056847, mailed Jun. 12, 2023; 9 pages.

*Primary Examiner* — Deoram Persaud
(74) *Attorney, Agent, or Firm* — Finnegan, Henderson, Farabow, Garrett & Dunner LLP

(57) ABSTRACT

A substrate warpage determination system comprises at least three first supporting devices and at least three second supporting devices, forming first and second substrate support areas configured to carry a substrate, an actuator configured to move the at least three second supporting devices in a vertical direction, and a controller to drive the actuator. The controller is configured to determine a force exerted by the actuator, compare the determined force exerted by the actuator at the position in a vertical direction of the second substrate support area relative to the first substrate support area to a predetermined force at a predetermined position in the vertical direction of the second substrate support area relative to the first substrate support area, and determine a warpage of the substrate from the comparison.

15 Claims, 8 Drawing Sheets

(56)               References Cited

U.S. PATENT DOCUMENTS

| | | | |
|---|---|---|---|
| 8,582,963 B2 * | 11/2013 | Li | F27D 19/00 |
| | | | 219/390 |
| 10,446,423 B2 * | 10/2019 | Su | H10P 72/0616 |
| 11,347,150 B2 | 5/2022 | Tel et al. | |
| 11,635,698 B2 | 4/2023 | Tel et al. | |
| 2002/0044864 A1 * | 4/2002 | Hyakudomi | H10P 72/7612 |
| | | | 414/784 |
| 2004/0031338 A1 | 2/2004 | Chen et al. | |
| 2007/0058173 A1 | 3/2007 | Holzapfel | |
| 2010/0110408 A1 | 5/2010 | Compen et al. | |
| 2014/0324221 A1 | 10/2014 | Chisholm et al. | |
| 2017/0038202 A1 * | 2/2017 | Saito | G01B 21/20 |
| 2019/0013225 A1 * | 1/2019 | Taguchi | H10P 72/0616 |
| 2020/0218169 A1 | 7/2020 | Van Haren et al. | |
| 2021/0116820 A1 * | 4/2021 | Van Dorst | G03F 7/70716 |
| 2022/0197155 A1 * | 6/2022 | Hermanussen | G03F 7/70708 |
| 2022/0276565 A1 * | 9/2022 | Kramer | G03F 7/70783 |

FOREIGN PATENT DOCUMENTS

| | | | |
|---|---|---|---|
| JP | H07-135227 A | 5/1995 | |
| TW | 2018-35676 A | 10/2018 | |
| TW | 2019-40985 A | 10/2019 | |

* cited by examiner

SUBSTRATE WARPAGE DETERMINATION SYSTEM

CROSS-REFERENCE TO RELATED APPLICATION

The application claims priority of EP application Ser. No. 22/166,063.2 which was filed on 31 Mar. 2022 and which is incorporated herein in its entirety by reference.

FIELD

The present invention relates to a substrate warpage determination system and a lithographic apparatus comprising such a substrate warpage determination system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

The wafer, or generally the substrate on which the pattern is to be projected, is held by a substrate support, such as a wafer table. Preferably, the substrate is flat, causing a projection surface on which the pattern is projected by the lithographic apparatus, to be flat. The substrate may however tend to exhibit some degree of unflatness, such as warpage. Due to warpage, unflatness of the substrate may occur, which may translate into overlay errors when projecting the pattern onto the substrate. Warpage of the substrate may result from various causes, such as the application of a coating on the surface of the substrate, or other processing steps performed on the surface of the substrate. The warpage may be counteracted by clamping the substrate onto the substrate table, e.g. by an electrostatic clamp. Thereto, it may be desirable to obtain information about a warpage of the unclamped substrate. Deformation of the substrate may be reduced by adjusting clamping forces to be able to flatten the warpage of the wafer by the clamping.

SUMMARY

Considering the above, it is an object of the invention to provide a means of measuring a warpage of the substrate.

According to an embodiment of the invention, there is provided a substrate warpage determination system, the system comprising:

at least three first supporting devices forming a first substrate support area configured to carry a substrate, at least three second supporting devices forming a second substrate support area configured to carry the substrate, an actuator configured to move the at least three second supporting devices in a vertical direction, and a controller configured to drive the actuator, wherein the controller is configured to:

determine a force exerted by the actuator, determine a position in the vertical direction of the second substrate support area relative to the first substrate support area, drive the actuator to move the at least three second supporting devices from one of:

a lower position wherein the second substrate support area is below the first substrate support area, as seen in a vertical direction, in order to carry the substrate by the first substrate support area, and an upper position wherein the second substrate support area is above the first substrate support area, as seen in the vertical direction, in order to carry the substrate by the second substrate support area, to the other one of the lower position and the upper position, and determine the force exerted by the actuator at the position in the vertical direction of the second substrate support area relative to the first substrate support area, as the at least three second supporting devices move from the one of the lower position and the upper position to the other one of the lower position and the upper position compare the determined force exerted by the actuator at the position in the vertical direction of the second substrate support area relative to the first substrate support area to a predetermined force at a predetermined position in the vertical direction of the second substrate support area relative to the first substrate support area, and determine a warpage of the substrate from the comparison.

According to a further embodiment of the invention, there is provided a lithographic apparatus comprising the substrate warpage determination system.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
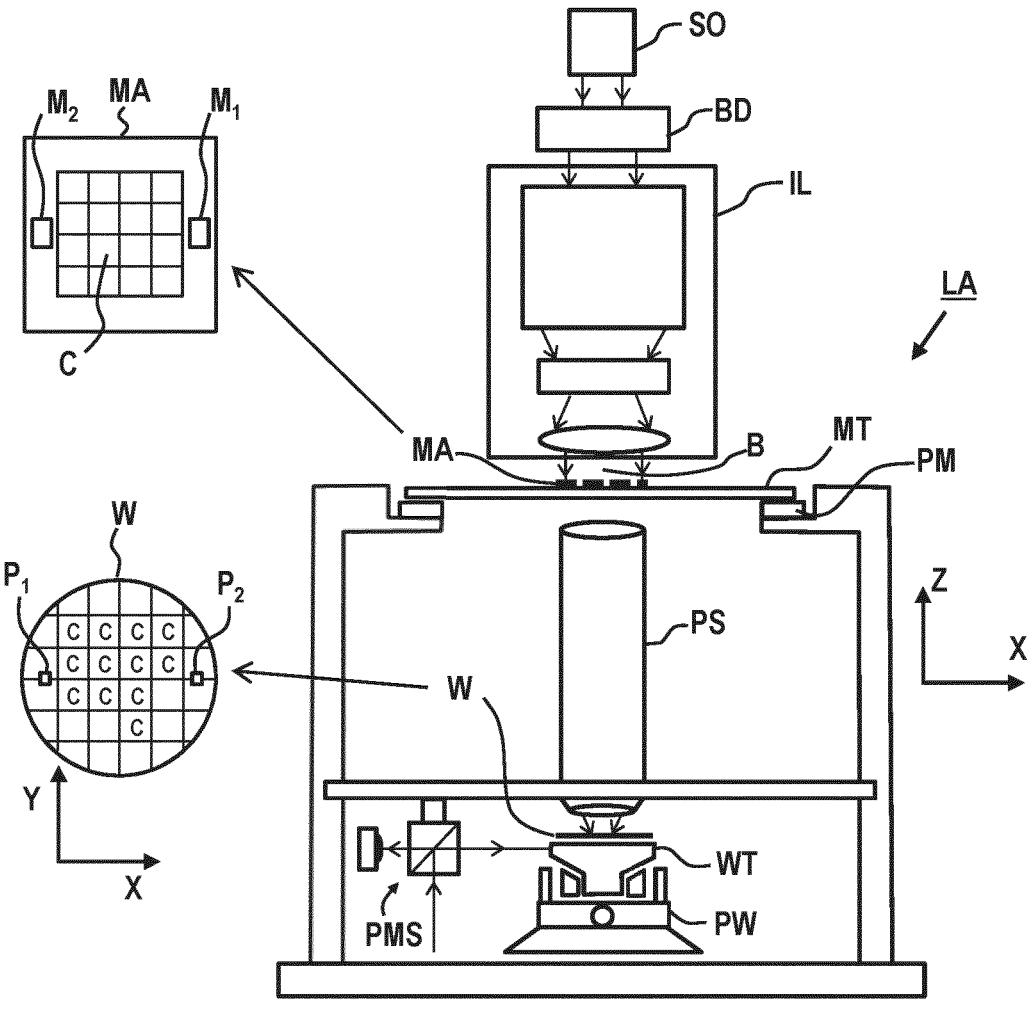
FIG. 1 depicts a schematic overview of a lithographic apparatus as may be employed according to an embodiment of the invention.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
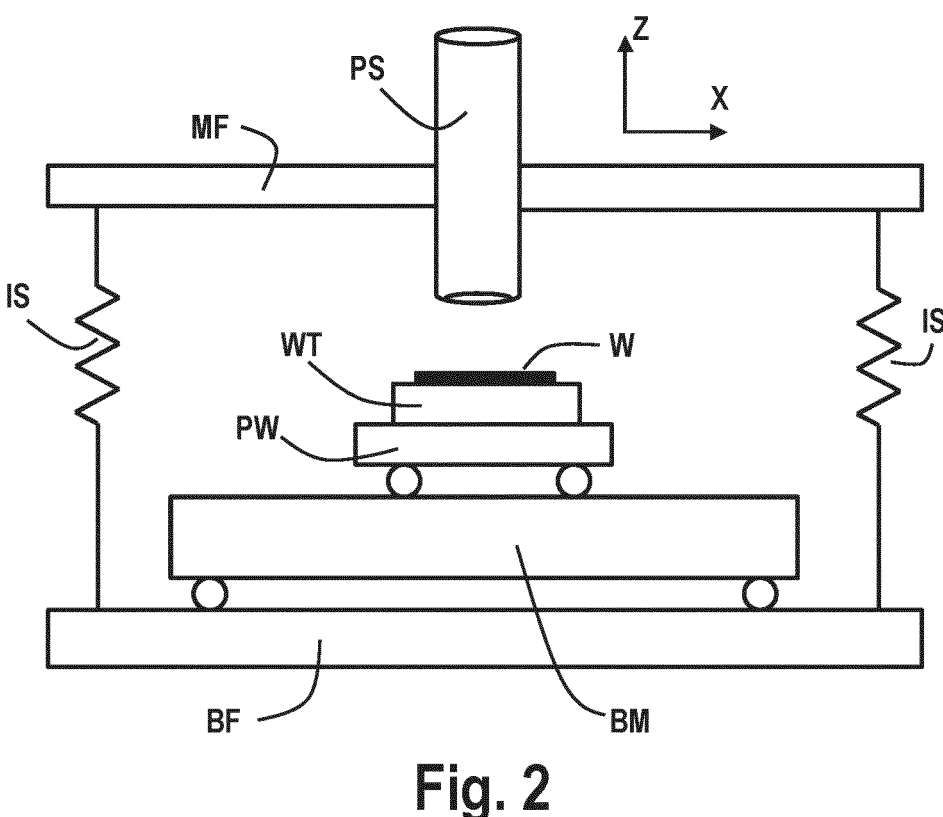
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference.

The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads is arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
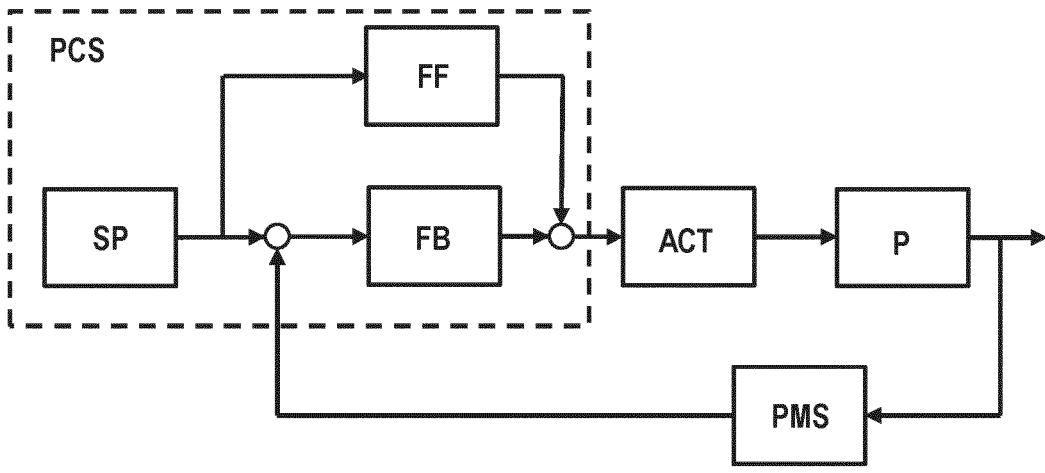
FIG. 3 schematically depicts a position control system as part of a positioning system as may be employed according to an embodiment of the invention.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
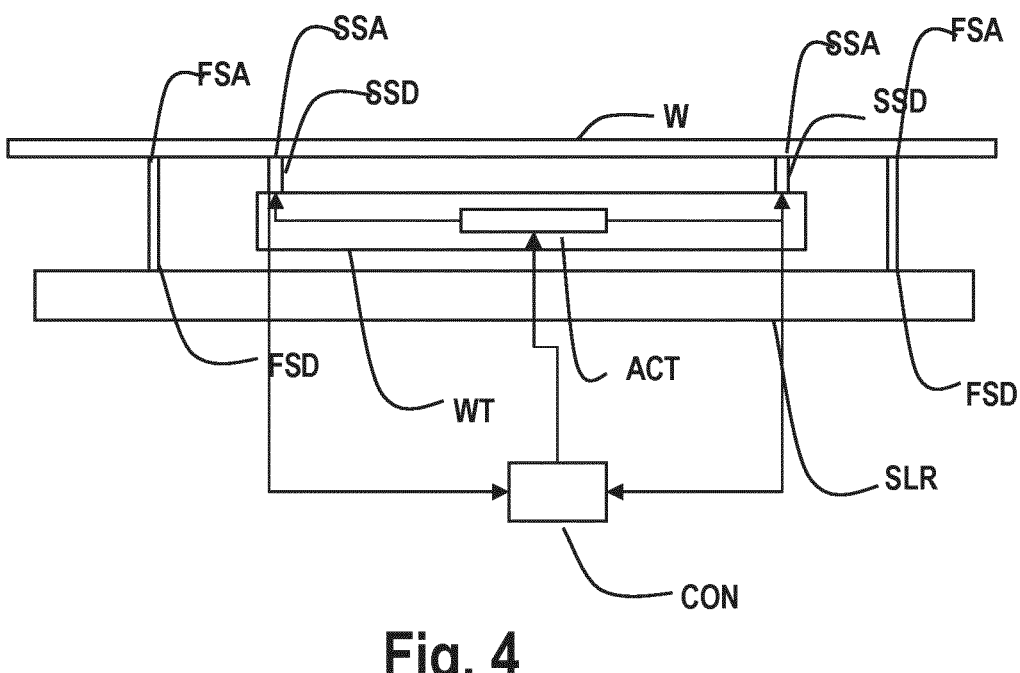
FIG. 4 schematically depicts a side view of a substrate warpage determination system.

FIG. 4 depicts a substrate W such as a wafer, which is supported by a substrate transfer robot SLR. More specifically, the substrate is supported by first supporting devices FSD which support the substrate. The first supporting devices exhibit a top surface, identified as the first supporting area FSA. The top surface of the first supporting devices supports the substrate W at a bottom side thereof. The first supporting devices FSD are comprised in the substrate transfer robot. The support transfer robot may for example load the substrate into the lithographic apparatus. The substrate is also supported by second supporting devices SSD which are comprised in the substrate support WT, such as the wafer table. The substrate support may be comprised in the lithographic apparatus. The second supporting devices may for example be formed by pins which extend from the substrate support. The second supporting devices exhibit a top surface, identified as the second supporting area SSA. The top surface of the second supporting devices supports the substrate at a bottom side thereof.

The substrate support is provided with an actuator ACT configured to move the second supporting devices in a vertical direction. The actuator may be formed by any suitable actuator, such as one or more piezo actuators or a linear motor. The actuator is driven by a control device CON such as a suitably programmed microcontroller, microprocessor or other control device. The control device is further provided as an input with a magnitude of the actuator force, which represents a magnitude of the force exerted by the actuator via the second supporting device on the substrate. The magnitude of the actuator force may be derived in any suitable way. For example, the control device may measure an electrical current or electrical power provided to the actuator. The electrical current or electrical power may be representative of the force applied by the actuator onto the substrate. In the case of an electric motor, such as a linear motor, the actuator force may be proportional to the motor current. As another example, force applied by the second supporting devices may be measured by a suitable force measurement sensor, a sensor signal representative if the measured force being provided to the control device.

The control device is configured to drive the actuator to move the second supporting devices in a vertical direction, as will be explained below with reference to FIGS. 5A-5C.

Figure 5A:
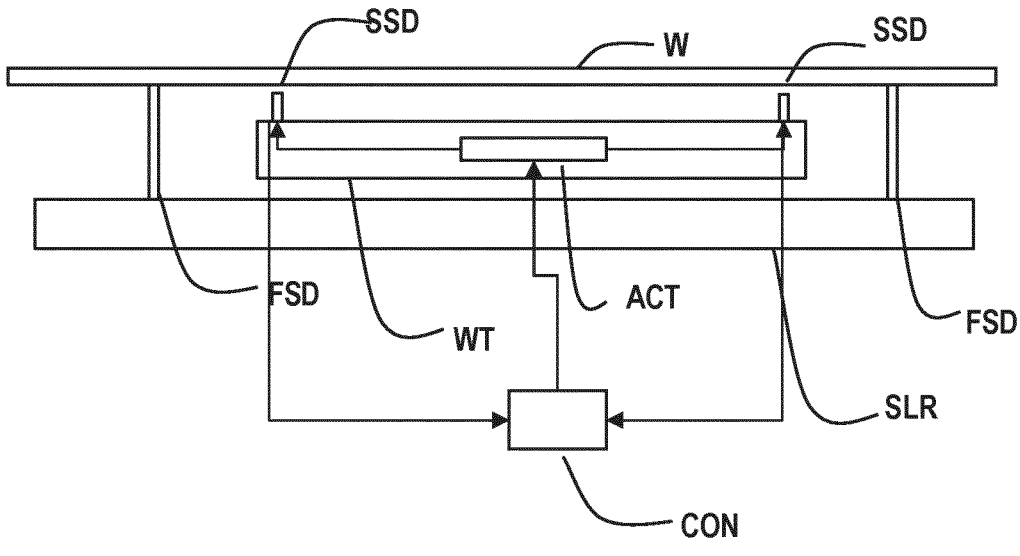
FIG. 5A-5C schematically depicts a side view of a substrate warpage determination system at successive states.
Figure 5B:
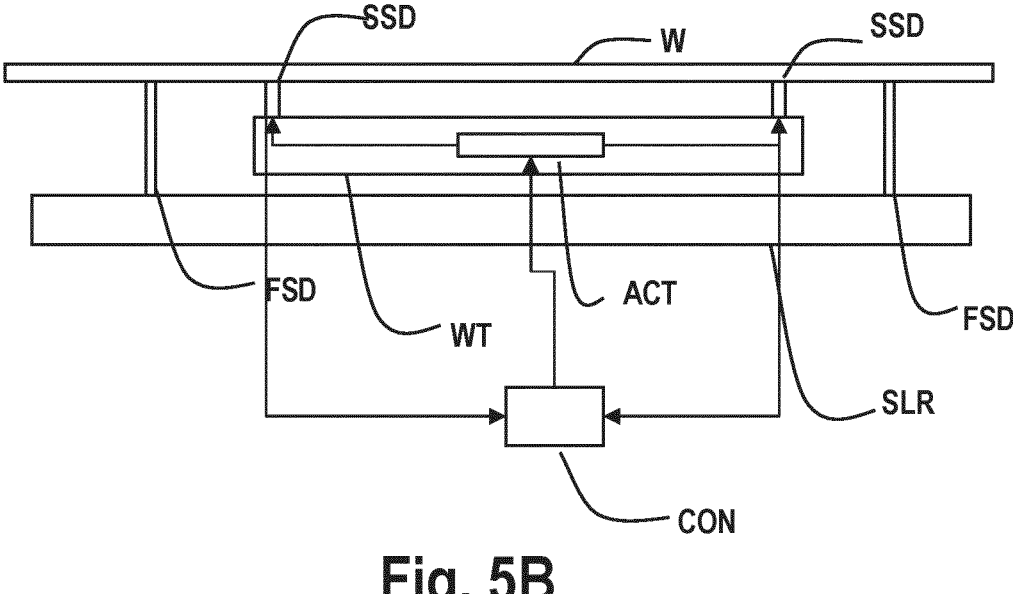
Figure 5C:
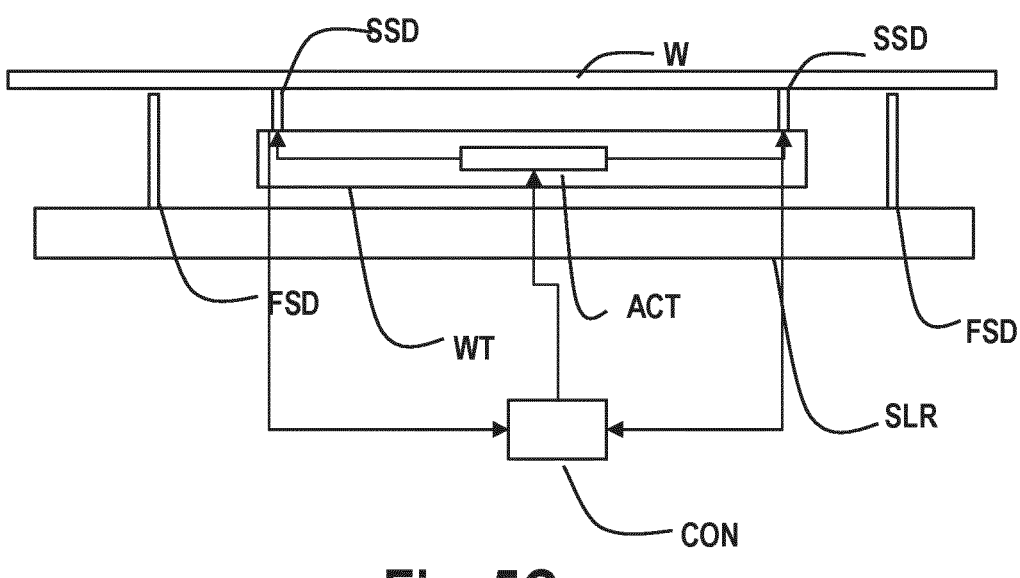

FIGS. 5A-5C each depict the substrate, substrate transfer robot and substrate support as depicted in FIG. 4. In FIG. 5A, the second supporting devices are in a lower position. That is, the substrate is supported by the first supporting devices, while not being carried by the second supporting devices. Accordingly, the substrate is carried by the first supporting area of the first supporting devices. In the present example, the force exerted by the actuator, via the second supporting devices onto the substrate, is zero. The weight of the substrate is accordingly carried by the first supporting devices.

As depicted in FIG. 5B, as the actuator is driven by the control device to move the second supporting devices upwardly, the first and second supporting devices carry the substrate. The substrate is carried by the first supporting area of the first supporting devices and by the second supporting area of the second supporting devices. As the second supporting devices are moved upwardly, the second supporting devices increasingly carry the weight of the substrate, thus the actuator force via the second supporting devices tends to increase.

As depicted in FIG. 5C, as the actuator is further driven by the control device to move the second supporting devices further upwardly, the second supporting devices carry the substrate while the first supporting devices are free from the substrate, i.e. do not carry the substate any more. The substrate is carried by the second supporting area of the second supporting devices.

FIG. 6A-6E depict a perspective view of a substrate exhibiting some degree of warpage, the substrate being carried by the first and/or second supporting devices.

Figure 6A:
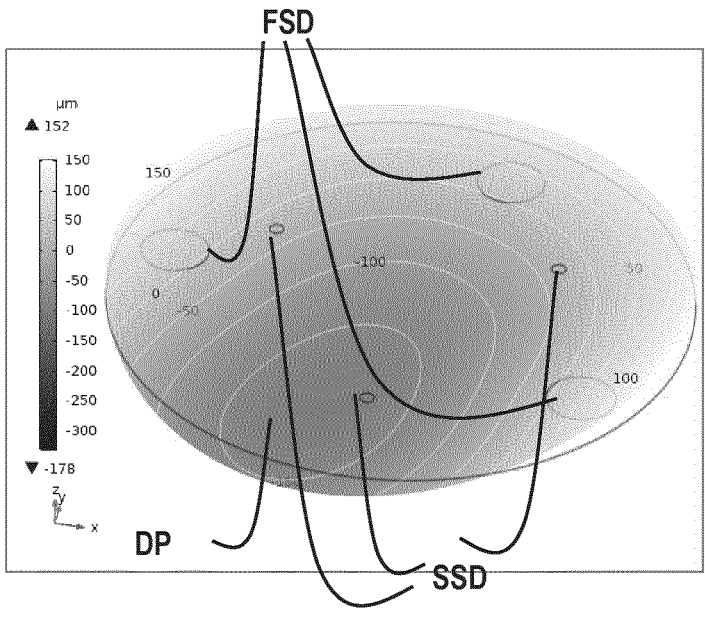
FIG. 6A-6E depict a perspective view of the substrate at various positions of the second supporting device in respect of the first supporting device.
Figure 6B:
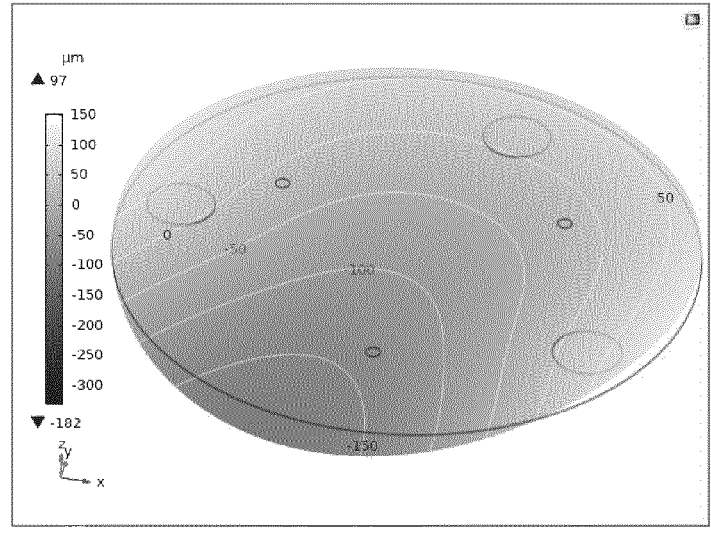
Figure 6C:
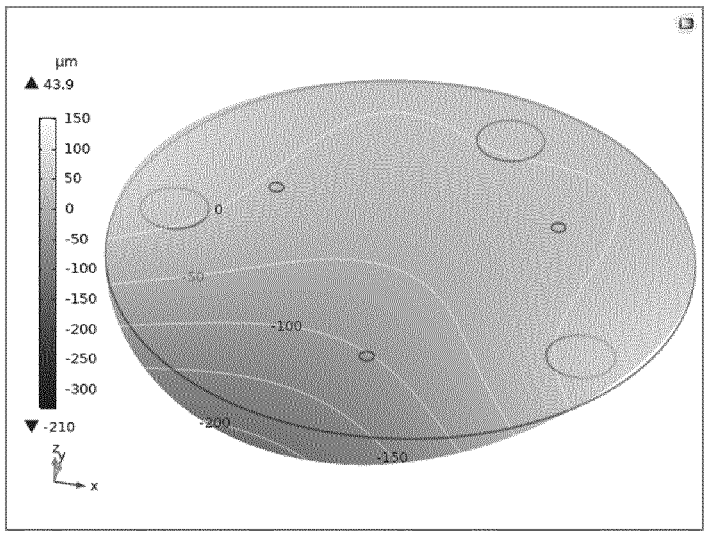
Figure 6D:
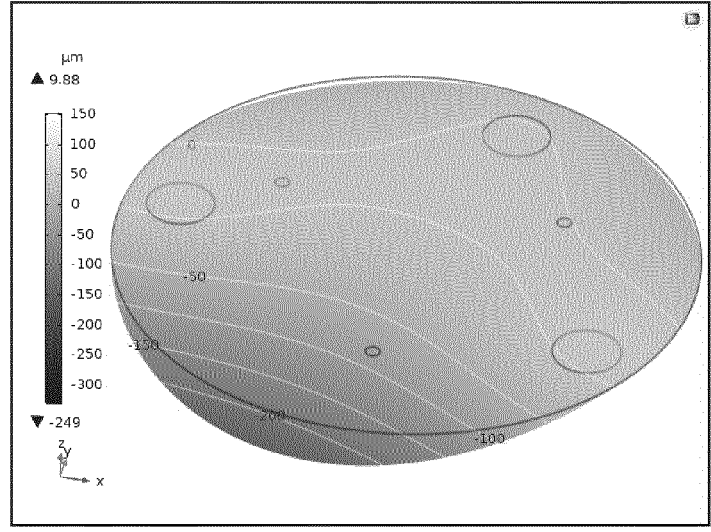

As depicted in FIG. 6A, the substrate is supported by three first supporting devices FSD, more specifically by the first supporting area of the first supporting devices. The second supporting devices SSD, in the present state, are free from the substrate, i.e. do not carry the substrate. In the present example, the second supporting surface of the second supporting devices is 200 micrometers below the first supporting surface of the first supporting devices. As a result of warpage of the substrate by itself, and possibly also as a result of gravity, the substrate exhibits some degree of warpage whereby the lowest part of the surface of the substrate is indicated by the deepest point DP. In FIGS. 6A-6E, the white lines represent "height lines", i.e. representing a same amount of deflection of the substrate in the vertical direction, as indicated by the specific numbers In FIG. 6B, the actuator has moved upwardly the second supporting devices by 100 micrometers, resulting in the first supporting devices still carrying a majority of the weight of the substrate.

In FIG. 6C, the actuator has again moved up the second supporting devices by 100 micrometers, resulting in the first supporting area of the first supporting devices and the second supporting area of the second supporting devices both carrying the weight of the substrate. The substrate tends to flatten to some degree.

In FIG. 6D, the actuator has again moved up the second supporting devices by 100 micrometers, resulting in the second supporting area of the second supporting devices carrying an increased part of the weight of the substrate. Warpage and/or deformation of the substrate again changes is respect of the warpage in FIG. 6C.

Figure 6E:
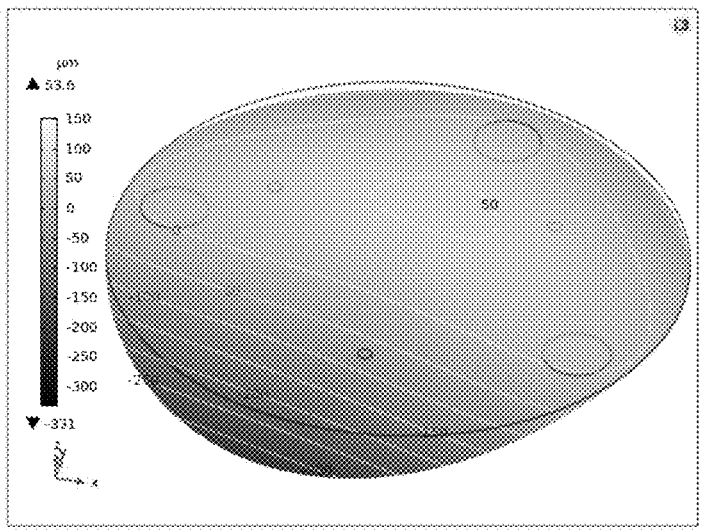

In FIG. 6E, the actuator has yet again moved up the second supporting devices by 100 micrometers, resulting in the second supporting area of the second supporting devices carrying the substrate, while the first supporting devices are free from the substrate.

Thus, in a sequence from FIG. 6A-FIG. 6E, the top surface of the second supporting devices is at −200 micrometers, −100 micrometres, 0 micrometers, +100 micrometers, +200 micrometers in respect of the top surface of the first supporting devices.

Figure 7:
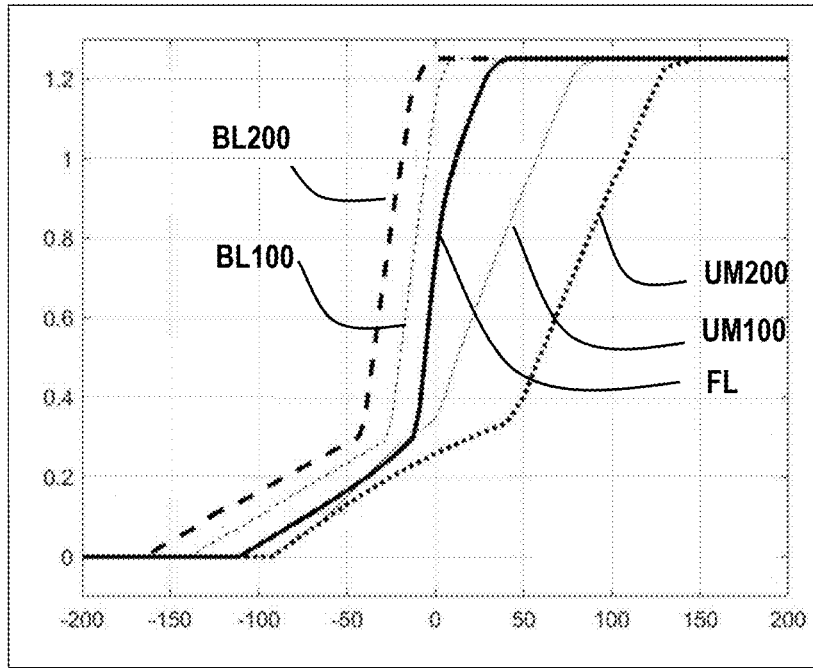
FIG. 7 depicts a graphical view of actuator force versus second supporting device position, at various levels of warpage of the substrate.

FIG. 7 depicts a graphical view of the force by the second supporting devices along the vertical axis versus the relative position of the second supporting devices in respect of the first supporting devices along the horizontal axis in FIG. 7. Similarly to FIGS. 4, 5A-5C and 6A-6E, the relative position of the second supporting devices in respect of the first supporting devices is to be understood as a position of the top surface of the second supporting devices in respect of the top surface of the first supporting devices, seen in a vertical direction.

Generally, as the second supporting devices are moved upwardly by means of the actuator, the force by the actuator increases until the full load of the substrate is carried by the second supporting devices. A takeover between the first and second supporting devices however depends on a warpage of the substrate, as illustrated in FIG. 7 and as further explained below.

FIG. 7 depicts the (modelled) actuator force in relation to the position of the second supporting device top surface relative to the position of the first supporting device top surface. At a relative position of 0, top surface of the first and second supporting devices is at a same level, i.e. at a same height as seen in the vertical direction. At a relative position of −100 micrometers, the top surface of the second supporting device is 100 micrometers below the top surface of the first supporting device. Correspondingly, at a relative position of +100 micrometers, the top surface of the second supporting device is 100 micrometers above the top surface of the first supporting structure.

With a flat substrate, the takeover of the second supporting device, i.e. the change in the actuator force tends to be around 0 micrometers relative position, as depicted by the curve FL. At an umbrella shaped substrate, i.e. at a warpage of the substrate in an "umbrella shape", the change in the actuator force tends to be above 0 micrometers relative position, as depicted by the curves UM100 and UM200 representing the actuator force at an umbrella shape of 100 micrometers and 200 micrometers respectively. At a bowl shaped substrate, i.e. at a warpage of the substrate in a "bowl shape", the change in the actuator force tends to be below 0 micrometers relative position, as depicted by the curves BL100 and BL200 representing the actuator force at a bowl shape of 100 micrometers and 200 micrometers respectively.

The control device is configured to determine the force exerted by the actuator at the position in the vertical direction of the second substrate support area relative to the first substrate support area, as the at least three second supporting devices move from the lower position to the upper position. The control device is provided with the force exerted by, i.e. applied by, the actuator as well as the position of the upper surface of the second supporting device relative to the surface of the first supporting device.

The control device is provided with calibration data that enables to derive a warpage of the substrate from the measured force and position. For example, the control device is provided with a predetermined force at a predetermined position in the vertical direction of the second substrate support area relative to the first substrate support area. By comparing the determined force exerted by the actuator at the position in the vertical direction of the second substrate support area relative to the first substrate support area to the predetermined force at the predetermined position in the vertical direction of the second substrate support area relative to the first substrate support area, a warpage of the substrate may be derived. For example, if the determined force at the determined position equals the predetermined force at the predetermined position, the warpage of the substrate may be the same as a predetermined warpage based on which the predetermined force at the predetermined positon have been determined. As another example, if the determined force exceeds the predetermined force (both at the same position) the warpage of the substrate may be different from the predetermined warpage in that the substrate is more bowl shaped. In the present examples, the first supporting devices are arranged more towards an outer perimeter of the substrate as compared to the second supporting devices. In this case, if the determined force exceeds the predetermined force (both at the same vertical position of the second supporting device relative to the first supporting device) the warpage of the substrate may be different from the predetermined warpage in that the substrate may be bowl shaped.

As another example, if the determined force is lower than the predetermined force (both at the same vertical position of the second supporting device relative to the first supporting device) the warpage of the substrate may be different from the predetermined warpage in that the substrate may be umbrella shaped. The larger the deviation between the determined force and the predetermined force, the more the shape may differ from the predetermine shape.

As described above, the control device accordingly determines the warpage of the substrate from the comparison.

Reverting to FIG. 7, the above described situation whereby at the predetermined position, the force by the actuator exceeds or subceeds the predetermined force, may be graphically illustrated as points vertically above each other, i.e. at the same position exhibiting different forces. Accordingly, the different curves UM200, UM100, FL, BW100, BW200, for example at the position 0, are arranged above each other.

As another example, the determination may be performed at the predetermined force. Thereby, the control device determines the position at which the actuator force is equal to a predetermined force.

For example, if the determined force at the predetermined position equals the predetermined force at the predetermined position, the warpage of the substrate may be the same as a predetermined warpage based on which the predetermined force at the predetermined positon have been determined. As another example, if the predetermined force is reached at a position which is above the predetermined position, the warpage of the substrate may be different from the predetermined warpage in that the substrate is more umbrella shaped. As another example, if the predetermined force is reached at a position which is below the predetermined position, the warpage of the substrate may be different from the predetermined warpage in that the substrate may be bowl shaped. The larger the deviation between the determined force and the predetermined force, the more the shape may differ from the predetermine shape.

Reverting to FIG. 7, the above described situation whereby at the predetermined force, the position is above or below the predetermined position, may be graphically illustrated as points horizontally arranged in respect of each other, i.e. at the same force exhibiting different positions. Accordingly, the different curves UM200, UM100, FL, BW100, BW200, for example at the force 1, are arranged horizontally spaced apart relative to each other.

Figure 8:
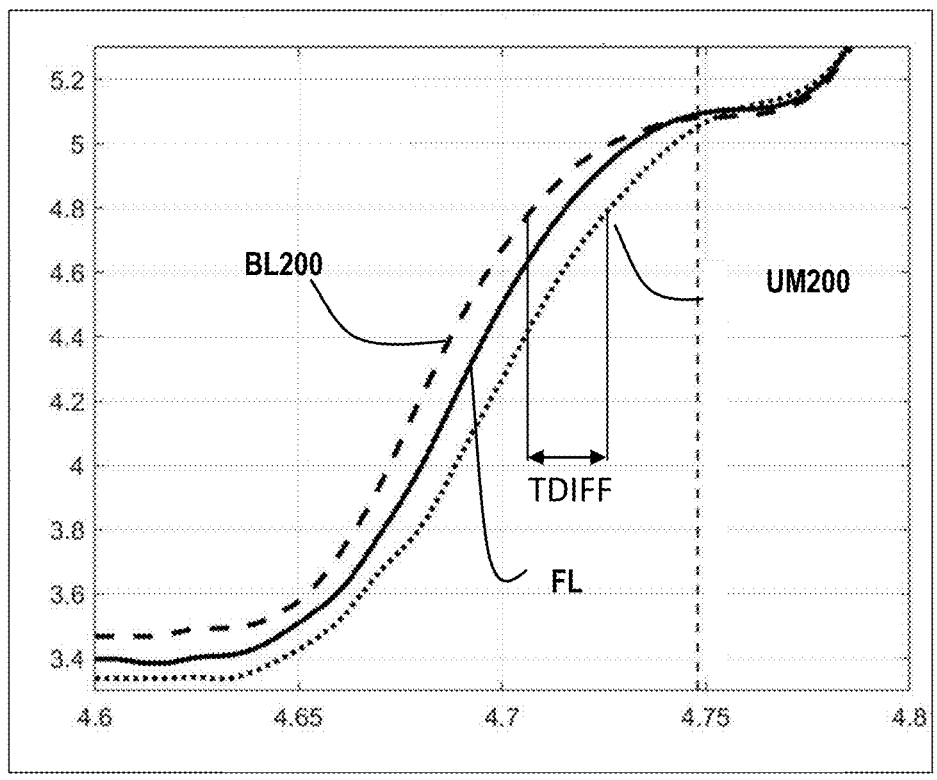
FIG. 8 depicts another graphical view of actuator force versus second supporting device position, at various levels of warpage of the substrate.

FIG. 8 depicts another example of (measured) actuator force versus second supporting device position, at various levels of warpage of the substrate. More specifically, in the present example, the second supporting device is moved upwardly at a constant velocity. Instead of depicting the position in vertical direction of the second supporting area relative to the first supporting area, time is depicted. In FIG. 8, a curve FL based on a flat substrate, a curve BW200 based on a bowl shape substrate with 200 micrometers warpage, and a curve UM200 based on an umbrella shape substrate with 200 micrometers warpage, is depicted. Similarly as described with reference to FIG. 7, a determination of warpage may be based on actuator force and/or on vertical position (i.e. in the present example represented by time). For example the time difference TDIFF represents a time difference to reach a predetermined actuator force.

A warpage, of e.g. 100 micrometres or 200 micrometers as in the above examples, may be understood as a difference in height between a centre of the substrate (or other extreme in height) and an edge of the substrate. The warpage of the substrate may be determined in an undisturbed state, i.e. not affected by forces such as gravity, clamping, etc.

The actuator force by the second supporting devices onto the substrate may be determined as a sum of the forces by the at least three second supporting devices onto the substrate.

The lower position of the second supporting device may be understood as a position wherein the second supporting device does not carry the substrate and the upper position of the second supporting device may be understood as a position wherein the second supporting device carries the substrate.

The control device may be a separate control device, such as a microprocessor or microcontroller provided with suitable software instructions. The control device may be implemented as software instructions on a microprocessor, microcontroller or other control device in a multi tasking environment.

In accordance with the above examples, the controller may be configured to determine the warpage of the substrate from the position in the vertical direction of the second substrate support area relative to the first substrate support area, at which the force exerted by the actuator changes as the at least three second supporting devices move from the one of the lower position and the upper position to the other one of the lower position and the upper position. Any suitable change of the actuator force may be taken into account. An accurate determination of the warpage may be provided by determining the warpage of the substrate from the position in the vertical direction of the second substrate support area relative to the first substrate support area at which the force exerted by the actuator changes to a predetermined fraction of the force exerted by the actuator in the upper position of the at least three second supporting devices, such as for example between 60% and 90%, more preferably 80% of the upper position.

The position of the second supporting devices may be controlled to change at a constant velocity, whereby the relative position of the second substrate support area is derived from the constant velocity and a time elapsed during moving the second substrate support area.

The described determination may be performed with an upward movement, i.e. from the lower position to the upper position as well as with a downward movement, i.e. from the upper position to the lower position. Making use of the upward movement, the warpage determination may be derived with the lifting movement whereby the substrate table lifts the substrate from the substrate transfer robot. Accordingly, the warpage may be determined based on a handling of the substrate as performed when loading the substrate, i.e. requiring no extra operations when loading the substrate. Similarly, as another example, the warpage may be determined when unloading the substrate from the lithographic apparatus by the substrate transfer robot. The determined warpage may be used in another tool to which the substrate is provided, when having been unloaded from the lithographic apparatus.

As depicted in FIGS. 6A-6E, the at least three first supporting devices may be arranged on a first circle extending in the horizontal plane and the at least three second supporting devices may be arranged on a second circle extending in the horizontal plane. The inventors have realized that the warpage of the substrate may largely by circularly symmetrical, hence the arrangement of the first and second supporting devices on respective first and second circles facilitating a determination of the circular warpage. A diameter of the first circle may differ from a diameter of the second circle, thereby enhancing an accuracy of the warpage determination. In case the second supporting devices are comprised in the substrate table to lift the substrate from the substrate transfer robot, known, existing structures may be applied to carry the substrate. Accordingly, no additional hardware may be required in an existing lithographic apparatus.

The first supporting devices may be distributed such that there is one plane of symmetry. For example, the second supporting device may be arranged on a circle at a angle from the first to the second and from the second to the third one of the second supporting device, which angle is the same and less than or more than 120 degrees.

The second supporting devices may be distributed such that there are three planes of symmetry. For example, the second supporting device may be arranged on a circle at a mutual angle of 120 degrees. A resulting arrangement of the second supporting devices may provide that a shape of the substrate under gravity is more close to (axi-) symmetrical.

The described substrate warpage determination system may be comprised in a lithographic apparatus. The lithographic apparatus may further comprise a substrate support configured to hold the substrate and a substrate transfer robot configured to load and/or unload the substrate. The at least three first supporting devices are comprised in the substrate transfer robot and the at least three second supporting devices are comprised in the substrate support of the lithograpic apparatus. The warpage determination may be derived when loading or unloading the substrate, i.e. as the substrate table lifts the substrate from the substrate transfer robot to load the substrate or as the substrate is transferred from the substrate support to the substrate transfer robot to unload the substrate. Accordingly, the warpage may be determined based on a handling of the substrate as performed when loading or unloading the substrate, i.e. requiring no extra operations when loading or unloading the substrate. The force exerted by the actuator and the position are measured as the substrate support lifts the substrate from the substrate transfer robot. The comparison to the predetermined force and predetermined position and the determining of the warpage of the substrate may then be performed as the substrate is loaded. For example, the determination of the warpage may be performed before clamping the substrate on the substrate support. Accordingly, the determined warpage of the substrate may be used to adjust the clamping force sequence to take account of the warpage of the substrate. The at least three second supporting devices may be formed by e-pins of the substrate support.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting.

The invention claimed is:

1. A substrate warpage determination system, comprising:
at least three first supporting devices forming a first substrate support area configured to carry a substrate;
at least three second supporting devices forming a second substrate support area configured to carry the substrate;
an actuator configured to move the at least three second supporting devices in a vertical direction; and
a controller configured to drive the actuator, wherein the controller is configured to:
determine a force exerted by the actuator;
determine a position in the vertical direction of the second substrate support area relative to the first substrate support area; and
drive the actuator to move the at least three second supporting devices from one of:
a lower position, wherein the second substrate support area is below the first substrate support area, as seen in a vertical direction, in order to carry the substrate by the first substrate support area, and
an upper position wherein the second substrate support area is above the first substrate support area, as seen in the vertical direction, in order to carry the substrate by the second substrate support area, to the other one of the lower position and the upper position, and
determine the force exerted by the actuator at the position in the vertical direction of the second substrate support area relative to the first substrate support area, as the at least three second supporting devices move from the one of the lower position and the upper position to the other one of the lower position and the upper position;
compare the determined force exerted by the actuator at the position in the vertical direction of the second substrate support area relative to the first substrate support area to a predetermined force at a predetermined position in the vertical direction of the second substrate support area relative to the first substrate support area, and
determine a warpage of the substrate from the comparison.

2. The substrate warpage determination system according to claim 1, wherein the controller is configured to determine the warpage of the substrate from the position in the vertical direction of the second substrate support area relative to the first substrate support area, at which the force exerted by the actuator changes as the at least three second supporting devices move from the one of the lower position and the upper position to the other one of the lower position and the upper position.

3. The substrate warpage determination system according to claim 2, wherein the controller is configured to determine the warpage of the substrate from the position in the vertical direction of the second substrate support area relative to the first substrate support area at which the force exerted by the actuator changes to a predetermined fraction of the force exerted by the actuator in the upper position of the at least three second supporting devices.

4. The substrate warpage determination system of claim 2, wherein the controller is configured to move the at least three second supporting devices from the one of the lower position and the upper position to the other one of the lower position and the upper position at a constant velocity, and wherein the controller is configured to derive the position of the second substrate support area from the constant velocity and a time elapsed during moving the second substrate support area.

5. The substrate warpage determination system of claim 1, wherein the predetermined fraction of the force exerted by the actuator in the upper position of the at least three second supporting devices is between 60% and 90%, more preferably 80%.

6. The substrate warpage determination system of claim 1, wherein the one of the lower position and the upper position is the lower position and wherein the other one of the lower position and the upper position is the upper position.

7. The substrate warpage determination system claim 1, wherein the at least three first supporting devices are arranged on a first circle extending in the horizontal plane and wherein the at least three second supporting devices are arranged on a second circle extending in the horizontal plane.

8. The substrate warpage determination system of claim 7, wherein a diameter of the first circle exceeds a diameter of the second circle.

9. The substrate warpage determination system of claim 7, wherein a diameter of the second circle exceeds a diameter of the first circle.

10. The substrate warpage determination system of claim 7, wherein the first supporting devices is distributed such that there is one plane of symmetry.

11. The substrate warpage determination system of claim 7, wherein the second supporting devices is distributed such that there are three planes of symmetry.

12. A lithographic apparatus comprising the substrate warpage determination system of claim 1.

13. The lithographic apparatus according to claim 12, further comprising a substrate support configured to hold the substrate and a substrate transfer robot configured to load or unload the substrate, wherein the at least three first supporting devices are comprised in the substrate transfer robot and the at least three second supporting devices are comprised in the substrate support of the lithograpic apparatus.

14. The lithographic apparatus according to claim 13, wherein the controller is configured to measure the force exerted by the actuator as the substrate is transferred from the substrate transfer robot to the substrate support or as the substrate is transferred from the substrate support to the substrate transfer robot, and to determine the warpage of the substrate before clamping the substrate on the substrate support.

15. The lithographic apparatus according to claim 14, wherein the at least three second supporting devices are e-pins of the substrate support.

* * * * *